US011764454B1

(12) United States Patent
Podell et al.

(10) Patent No.: US 11,764,454 B1
(45) Date of Patent: Sep. 19, 2023

(54) COMPACT IMPEDANCE TRANSFORMING COMBINER/DIVIDER AND METHOD OF MAKING

(71) Applicant: Werlatone, Inc., Brewster, NY (US)

(72) Inventors: Allen F. Podell, Palo Alto, CA (US); Ky-Hien Do, Carp (CA); William Deering, New York City, NY (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 18/047,838

(22) Filed: Oct. 19, 2022

(51) Int. Cl.
H01P 5/18 (2006.01)
H03F 1/02 (2006.01)
H03H 7/38 (2006.01)

(52) U.S. Cl.
CPC ............. *H01P 5/18* (2013.01); *H03F 1/0288* (2013.01); *H03F 2200/451* (2013.01)

(58) Field of Classification Search
CPC ...... H01P 5/02; H01P 5/10; H01P 5/12; H01P 5/18; H03F 1/0288; H03F 3/195; H03F 3/68; H03H 7/38; H03H 7/40; H03H 7/42; H03H 7/46; H03H 7/48; H03H 2007/386; H01F 19/04; H01F 27/34
See application file for complete search history.

(56) References Cited

U.S. PATENT DOCUMENTS

| 4,590,446 A | 5/1986 | Hsu et al. |
| 4,673,899 A | 6/1987 | Jesperson et al. |
| 5,256,988 A | 10/1993 | Izadian |
| 5,889,444 A | 3/1999 | Johnson et al. |
| 7,583,160 B2 * | 9/2009 | London .................... H01P 5/02 333/33 |
| 8,248,181 B2 | 8/2012 | Podell |
| 8,368,485 B2 * | 2/2013 | Brown ...................... H01P 5/12 333/120 |
| 8,493,162 B1 * | 7/2013 | Podell ....................... H01P 5/10 333/136 |
| 8,860,529 B2 | 10/2014 | Mei et al. |
| 9,419,323 B2 | 8/2016 | Shinohara et al. |
| 9,438,200 B2 * | 9/2016 | Goumas ................. H03H 7/383 |
| 9,537,198 B2 * | 1/2017 | Seneviratne .......... H03F 1/0288 |
| 9,979,067 B2 | 5/2018 | Danderson |

(Continued)

OTHER PUBLICATIONS

Ghanadi, Mehdi, Thesis "A New Compact Broadband Radial Power Combiner", Nov. 30, 2011, 116 pgs, *pp. 53-75 are believed to be the most relevant.

(Continued)

*Primary Examiner* — Quochien B Vuong
(74) *Attorney, Agent, or Firm* — Kolisch Hartwell, P.C.

(57) ABSTRACT

A combiner/divider and method of designing a combiner/divider providing a single impedance transformation between a sum port and component ports with a determined insertion-loss variation over a determined operating bandwidth. Preferably the lowest number impedance-transformer sections are included that provide impedance transformation between the sum port and the component ports. A junction network preferably electrically connects a junction-network sum node to each of N junction-network component nodes. The junction-network sum node is connected to the sum port through at least a first impedance-transformer section of the ZT impedance-transformer sections. Each junction-network component node is connected to a respective one of the plurality of component ports through at least a respective second impedance-transformer section of the ZT impedance-transformer sections.

21 Claims, 14 Drawing Sheets

(56) References Cited

U.S. PATENT DOCUMENTS

| | | | |
|---|---|---|---|
| 10,535,912 B2 * | 1/2020 | Senior | H01P 5/16 |
| 10,536,128 B1 | 1/2020 | Podell et al. | |
| 10,658,727 B1 | 5/2020 | Foti | |
| 11,011,818 B1 | 5/2021 | Do et al. | |
| 2005/0174194 A1 | 8/2005 | Wu et al. | |

OTHER PUBLICATIONS

Steer, Michael, North Carolina State University, "Microwave and RF Design III—Networks", Jun. 4, 2022, 244 pgs *sections 7.4.1-7.7.3 are believed to be the most relevant.

Matthaei, George L. et al., "Microwave Filters, Impedence-Matching Networks and Coupling Structures" (c) 1980, 558 pgs, *pp. 255-293, 429, 481-486 are believed to be the most relevant.

Cohn, Seymour B., "Optimum Design of Stepped Transmission-Line Transformers", IRE Transactions—Microwave Theory and Techniques, Apr. 1955, pp. 16-21.

Young, Leo, "Tables for Cascaded Homogeneous Quarter-Wave Transformers", IRE Transactions on Microwave Theory and Techniques, Apr. 1959, pp. 233-237.

Mount and Begg, "Correction—Parametric Devices and Masers: An annotated Bibliography", 1960, p. 243.

Silicon Labs, "AN1275: Impedance Matching Network Architectures", Dec. 21, 2020, 40 pgs.

Fathy, Aly E. et al., "A Simplified Design Approach for Radial Power Combiners", IEEE Transactions on Microwave Theory and Techniques, vol. 54, No. 1, Jan. 2006, pp. 247-255.

* cited by examiner

COMPACT IMPEDANCE TRANSFORMING COMBINER/DIVIDER AND METHOD OF MAKING

FIELD

This disclosure relates to transmission-line combiners and dividers. More specifically, the disclosed embodiments relate to apparatus and methods for transforming circuit impedances between a sum port and a plurality of component ports.

INTRODUCTION

There are various reasons for dividing and combining high-power high-frequency signals. For example, a signal may be divided into multiple signal paths so that each signal path has a power level that individual amplifiers can efficiently process. The outputs of the amplifiers may then be combined to form an amplified high-power signal. A signal may also be divided into multiple signal paths for feeding a phased-array antenna. One approach to dividing a signal or combining multiple signals is to divide in stages, with each stage combining or dividing two signals at a time. The tree-structures that divide or combine two signals at a time utilize a multitude of couplers and connecting transmission-line segments, which add losses and significantly degrade the overall combining efficiency, especially for higher numbers of lines. Other approaches divide a signal or combine multiple signals in a single stage. An example of the latter form is a radial combiner/divider. Such single-stage combiners/dividers are comparatively efficient but are complex to design. They typically have a narrow bandwidth, suffer from propagation of higher transmission modes due to a low junction impedance, and manufacturing is difficult.

Impedance transformers transform an input impedance to an output impedance in a single signal line. In order for a power combiner/divider to provide a desired frequency bandwidth as well as match input and output characteristic impedances, a combiner/divider is commonly configured as a combination of separate cascaded and parallel multi-step impedance transformers. The computations are conventionally simplified by constraining the impedance value at each junction to a suitable real impedance (resistance) value where a local sum line is divided into two or more local component lines as well as treating the external input and output impedances as real impedances. For a single-stage radial combiner/divider having one junction, the sum line is conventionally one impedance transformer and each component line is another impedance transformer. Thus, the design of a combiner/divider is reduced to a set of single-line impedance transformers.

Transforming a combiner/divider into a stepped-impedance combiner/divider is a mathematics-intensive operation. The mathematics is made even more complex by the need to transform between impedances that are constrained to be real impedances with no imaginary impedance component. The mathematics necessary to determine the number of steps needed in each impedance transformer, as well as the mathematics necessary to determine an operational passband specification of the combiner/divider, commonly involves application of a Tchebycheff polynomial, which is then used to obtain an estimate of the maximum voltage standing wave ratio (VSWR) and the bandwidth. From the solved Tchebycheff polynomial, the estimated maximum VSWR over the specified bandwidth and the impedance for each step of the output lines can be determined. All imaginary impedance components produced by each impedance transformer is compensated for in that impedance transformer.

The mathematics necessary for these calculations are known. Calculations and data are available for determining the number and impedance values of transformer sections can be found, for example, in an article authored by S. B. Cohn entitled "Optimum Design of Stepped Transmission-Line Transformers," in *IRE Trans. on Microwave Theory and Techniques*, vol. MTT-3, pp. 16-21, April 1955, an article authored by L. Young entitled "Tables for Cascaded Homogeneous Quarter-Wave Transformers," in IRE Transactions on Microwave Theory and Techniques, vol. 7, no. 2, pp. 233-237, April 1959, and a textbook authored by G. L. Matthaei et al. entitled "Microwave Filters, Impedance-Matching Networks, and Coupling Structures", Artech House, 1980, which references are incorporated herein by reference. Software modeling and analyzing the impedance transformer design is run to develop simulated designs.

A conventional approach in designing a radial combiner/divider is thus to design a impedance transformer for the sum line and an impedance transformer for each component line. Each impedance transformer is designed to provide impedance transformation that has the determined number of steps appropriate for the design bandwidth and transmission efficiency between real impedances.

Separate impedance transformers are also conventionally determined for each type of transmission line in a combiner/divider, such as waveguide, coaxial transmission line, coplanar waveguide, slotline, strip line, or microstrip line. Each of these additional impedance transformers are cascaded to provide a network of impedance transformers.

SUMMARY

The following description and claims pertain to a compact combiner/divider and method of designing a combiner/divider that is based on a single impedance transformation between a sum port and component ports. In some embodiments, the impedance transforming combiner/divider has a determined insertion-loss variation over a determined operating bandwidth. The sum port is configured to be connected to a first external circuit having a first external-circuit impedance. N component ports are each configured to be attached to a respective second external circuit having a respective second external-circuit impedance, where N is an integer greater than one. A junction network preferably electrically connects a junction-network sum node to each of N junction-network component nodes.

ZT quarter-wavelength impedance-transformer sections are distributed in series between the sum port and each of the N component ports by way of the junction network. The ZT impedance-transformer sections transform impedance between the first external-circuit impedance of the sum port and the respective second external-circuit impedance of each of the component ports. ZT is an integer greater than one and is less than two times the lowest number of impedance-transformer sections that provide impedance transformation between the first external-circuit impedance and each second external-circuit impedance over the determined operating bandwidth of the combiner/divider for the determined insertion-loss variation. The junction-network sum node is connected to the sum port through at least a first impedance-transformer section of the ZT impedance-transformer sections. Each junction-network component node is connected to a respective one of the plurality of component ports through at least a respective second impedance-transformer section of the ZT impedance-transformer sections.

In some examples, the junction network includes at least a first junction, a first junction impedance at the first junction toward the sum port, and a second junction impedance at the first junction toward the component ports. The first and second junction impedances are complex impedances, and the imaginary part of the first junction impedance is a conjugate of the imaginary part of the second junction impedance over the operating bandwidth.

The imaginary part of the first junction impedance preferably varies from a low end of the operating bandwidth to a high end of the operating bandwidth in a first direction and the imaginary part of the second junction impedance preferably varies from the low end of the operating bandwidth to the high end of the operating bandwidth in a second direction that is opposite to the first direction.

In some embodiments, a method of designing an impedance transforming combiner/divider is provided. The method preferably includes determining a target operating bandwidth and insertion-loss variation of the combiner/divider, as well as determining a first external-circuit impedance of a first external circuit to which a sum port of the combiner/divider is to be connected and a respective second external-circuit impedance of a respective second external circuit to which each of a plurality of component ports is to be connected. Based at least in part on these determinations, a number ZT of quarter-wavelength impedance-transformer sections is determined that is greater than one and less than two times the lowest number of quarter-wavelength impedance-transformer sections that provide impedance transformation between the first external-circuit impedance and each of the second external-circuit impedances over the operating bandwidth of the combiner/divider.

A configuration of a junction network electrically connecting a junction-network sum node to each of a plurality of junction-network component nodes is determined. Further, a position of each of the impedance-transformer sections distributed in series between the sum port and each of the component ports by way of the junction network is determined. The number of impedance-transformer sections between the sum port and each of the component ports is constrained to ZT. The junction-network sum node is connected to the sum port through at least a first impedance-transformer section of the ZT impedance-transformer sections and each junction-network component node is connected to a respective one of the component ports through at least a respective second impedance-transformer section of the ZT impedance-transformer sections. An impedance value of each of the impedance-transformer sections is also determined.

In some examples, determining the configuration of the junction network includes determining a configuration of at least a first junction, and the method further includes determining a complex first junction impedance at the first junction toward the sum port and a complex second junction impedance at the first junction toward the component ports, wherein the imaginary part of the first junction impedance is a conjugate of the imaginary part of the second junction impedance. Determining a complex first junction impedance and a complex second junction impedance may include determining an imaginary part of the first junction impedance that varies from a low end of the operating bandwidth to a high end of the operating bandwidth in a first direction and an imaginary part of the second junction impedance that varies from the low end of the operating bandwidth to the high end of the operating bandwidth in a second direction that is opposite to the first direction.

Features, functions, and advantages may be achieved independently in various embodiments of the present disclosure, or may be combined in yet other embodiments, further details of which can be seen with reference to the following description and drawings.

DESCRIPTION

Figure 1:
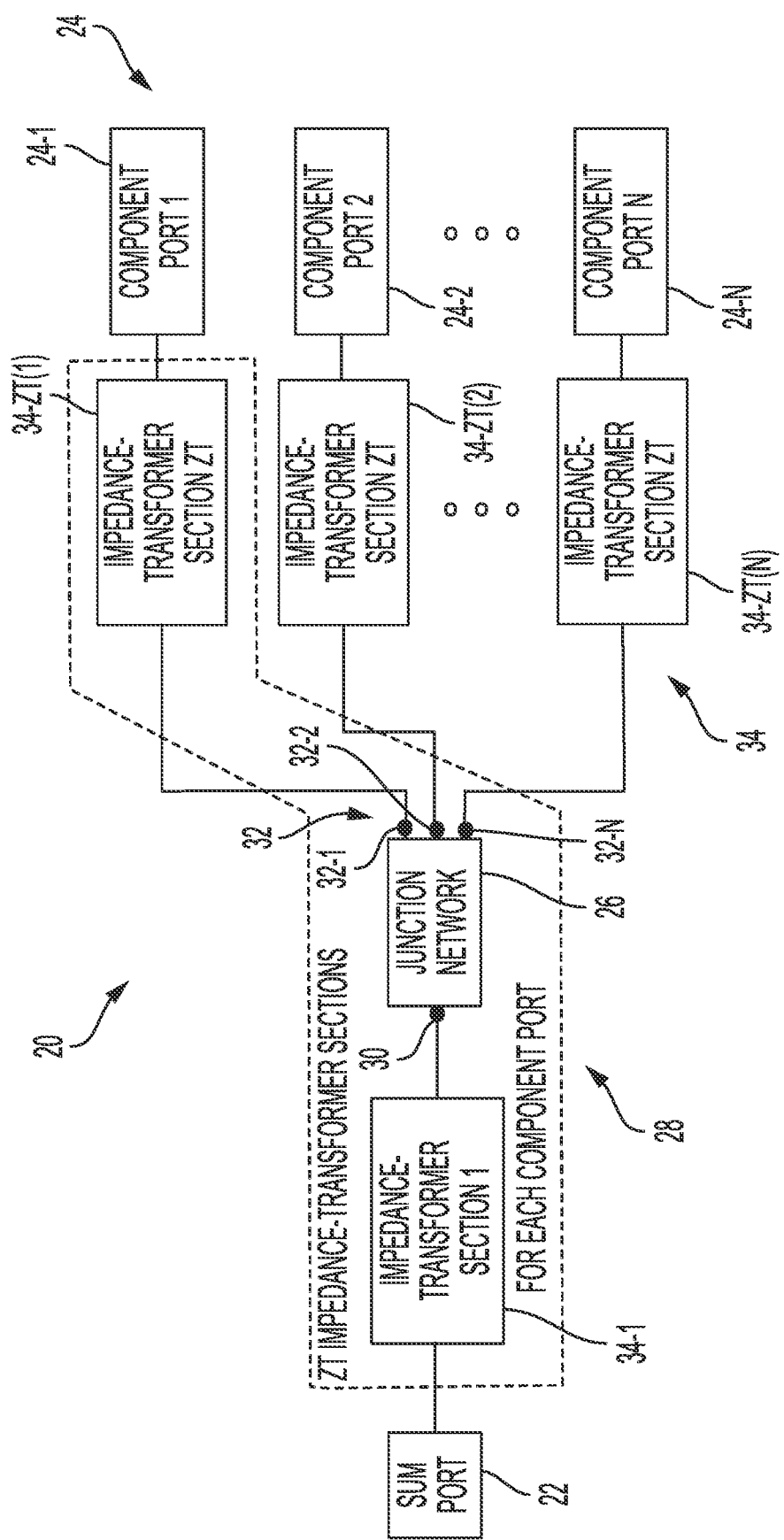
FIG. 1 is a block diagram showing general features of a compact impedance transforming combiner/divider.

Various embodiments of a compact impedance-transforming combiner/divider are described below and illustrated in the associated drawings. Unless otherwise specified, a compact impedance-transforming combiner/divider and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other combiner/dividers. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

A compact impedance-transforming combiner/divider is a combiner/divider that includes a junction network that connects a sum line to each of a plurality of components lines. Stepped quarter-wavelength impedance-transformer sections are preferably distributed in series between the sum port and each of the N component ports by way of the junction network. The number of impedance-transformer sections is less than the number that would be required to provide a complete impedance transformer between the sum port and a junction in the junction network and a separate complete impedance transformer between the junction and each component port for a design output variation level over a determined operating bandwidth. The impedance at the junction is not predetermined and is not constrained to be a real impedance.

Definitions

"Bandwidth" is the range of a band of frequencies expressed as the difference between limiting frequencies of the band. Commonly, a circuit bandwidth includes frequencies for which a signal transmission amplitude is within 3 dB of a maximum value in the bandwidth. This is referred to as the 3 dB bandwidth. In some applications, the signal transmission attribute is other than 3 dB of a maximum value or within a range of a given amplitude, such as within 0.5 dB, in the bandwidth. Examples of signal transmission attributes include insertion loss, power level, transmission coefficient, and the like. Bandwidth may also be identified conventionally based on a signal input loss, such as return loss, Voltage Standing Wave Ratio (VSWR), or attenuation coefficient, all of which may be considered to be signal transmission attributes.

As used herein and illustrated in FIG. 4 discussed below, cutoff frequencies for a device are the upper cutoff frequency and lower frequency where the transmitted signal is 3 dB below (and the insertion loss is 3 dB above) the highest power level between these band-limiting cutoff frequencies. The 3 dB bandwidth is the difference between the upper cutoff frequency and lower cutoff frequency. The center frequency is the frequency that is half way between the lower cutoff frequency and the upper cutoff frequency. The lower roll-off frequency is the frequency below which the insertion loss increases monotonically to the lower cutoff frequency. The upper roll-off frequency is the frequency above which the insertion loss increases monotonically to the upper cutoff frequency. The insertion-loss variation is the amount of variation in the insertion loss level over the frequency band between the lower and upper roll-off frequencies. Lower and upper operating-band frequencies are the frequencies between which the insertion loss is within the insertion-loss variation Accordingly, the operating bandwidth is the range of frequencies between the upper and lower operating-band frequencies.

The amount of loss of a signal transferred through a medium relative to the signal input into the medium is characterized in the frequency domain as the insertion loss. Insertion loss is derived from the magnitude of $S_{12}$ in a scattering-parameter (S-parameter) matrix and expressed in decibels (dB), where port 1 is input and port 2 is output. Standard nomenclature is to express insertion loss as a positive number when there is signal attenuation and a negative number when there is signal gain. Thus, for example, insertion loss of 40 dB corresponds to 40 dB of signal attenuation and a gain of −40 dB. Insertion loss (IL) is defined in the following equation, where VI is the voltage at the input and $V_o$ is the voltage at the output.

$$IL = -20 \log_{10}|V_I/V_o| = -20 \log_{10}|S_{12}|$$

"Quarter-wavelength section" is a length of a transmission line that functions as an electrical length that is within ten percent of a quarter-wavelength of a design frequency, such as a center frequency, within an operating bandwidth of a device.

A "node" is a location on a circuit between two circuit elements or components. In circuit diagrams, connections are ideal wires with zero resistance, so a node consists of the entire section of wire between elements, not just a single point. A node of a circuit, such as a terminal, pair of terminals, or connector, that is available or configured for connection to an external circuit is referred to as a "port."

Two conductors are electrically connected when there is an electron current path between them, including any conductors and electron-conductive electrical elements, such as resistors and inductors, but not coupling by either electromagnetic induction such as inductive coupling or capacitive coupling, or electromagnetic radiation such as radio waves. Two conductors or other components are directly electrically connected when there are no intervening electrical elements.

Ordinal terms such as "first", "second", and "third" are used to distinguish or identify various members of a group, or the like, in the order they are introduced in a particular context and are not intended to show serial or numerical limitation, or be fixed identifiers for the group members. Accordingly, the ordinal indicator used for a particular element may vary in different contexts.

Where "a" or "a first" element or the equivalent thereof is recited, such usage includes one or more such elements, neither requiring nor excluding two or more such elements.

The following sections describe selected aspects of exemplary compact impedance transforming combiner/dividers as well as related systems and methods. The examples in these sections are intended for illustration and should not be interpreted as limiting the entire scope of the present disclosure. Each section may include one or more distinct inventions, and/or contextual or related information, function, and/or structure.

Example 1

FIG. 1 illustrates an exemplary compact impedance transforming combiner/divider 20 having a determined insertion loss level over a determined operating bandwidth. Combiner/divider 20 includes a sum port 22, a plurality of component ports 24, a junction network 26, and an impedance transformer 28. Sum port 22 is configured to be connected to a first external circuit (not shown) having a first external-circuit impedance.

Component ports 24 include N component ports each configured to be attached to a respective second external circuit (not shown) having a respective second external-circuit impedance, where N is an integer greater than one. In this example for illustration purposes, component ports 24 include N component ports including at least a first component port 24-1 and a second component port 24-2. In examples where N is greater than two there are one or more additional component ports, with the Nth component port shown as component port 24-N.

Junction network 26 includes and electrically connects a junction-network sum node 30 to each of N junction-network component nodes 32, including component nodes 32-1, 32-2, and 32-N in this example. Junction network 26 may be a single-stage network in which case it has only one junction that divides the sum signal line into the N component signal lines. The junction network may also have more than one stage, wherein each stage after the first stage divides each stage component line into a subset of the N component lines.

Impedance transformer 28 includes ZT quarter-wavelength impedance-transformer sections 34 distributed in series between sum port 22 and each of the N component ports 24 by way of junction network 26. Impedance-transformer sections 34 transform impedance between the first external-circuit impedance of sum port 22 and the respective second external-circuit impedance of each of component ports 24. The plurality of impedance transforming sections may all be of the same type of transmission line or include different types. For example, an impedance-transformer section may be a waveguide, a coaxial transmission line, a slotline, a stripline, a microstrip, or a coplanar waveguide.

ZT is an integer greater than one and is less than two times the lowest number of impedance-transformer sections that provide impedance transformation between the first external-circuit impedance and each second external-circuit impedance over the determined operating bandwidth of the combiner/divider.

Junction-network sum node 30 is connected to sum port 22 through at least a first impedance-transformer section 34-1 of the ZT impedance-transformer sections. Each junction in the junction network may provide impedance transformation between the sum node of the junction and the component nodes of the junction, in which case the junction is also treated as an impedance-transformer section 34. The junction network does contribute to the impedance of the combiner/divider. The impedance at each junction is not constrained to be only a real impedance, and so is typically a complex impedance.

Each junction-network component node 32 is connected to a respective one of the plurality of component ports 24 through at least a respective second impedance-transformer section 34-ZT of the ZT impedance-transformer sections. In this example, impedance-transformer sections 34-ZT include impedance-transformer sections 34-ZT(1), 34-ZT(2), and 34-ZT(N) connected to respective component ports 24-1, 24-2, and 24-N.

It will be appreciated that combiner/divider 20 does not include one impedance transformer between sum port 22 and junction network 26 and another impedance transformer between junction network 26 and each component port 24. The term "impedance transformer" refers to a set of impedance transformers that are sufficient to provide a predetermined insertion-loss variation over a predetermined operating bandwidth while transforming an input impedance to an output impedance. Impedance transformer 28 thus provides signal transmission characteristics, such as insertion-loss variation, specified for a particular operating bandwidth by transforming the impedances using a reduced number of impedance-transformer sections 34.

Figure 2:
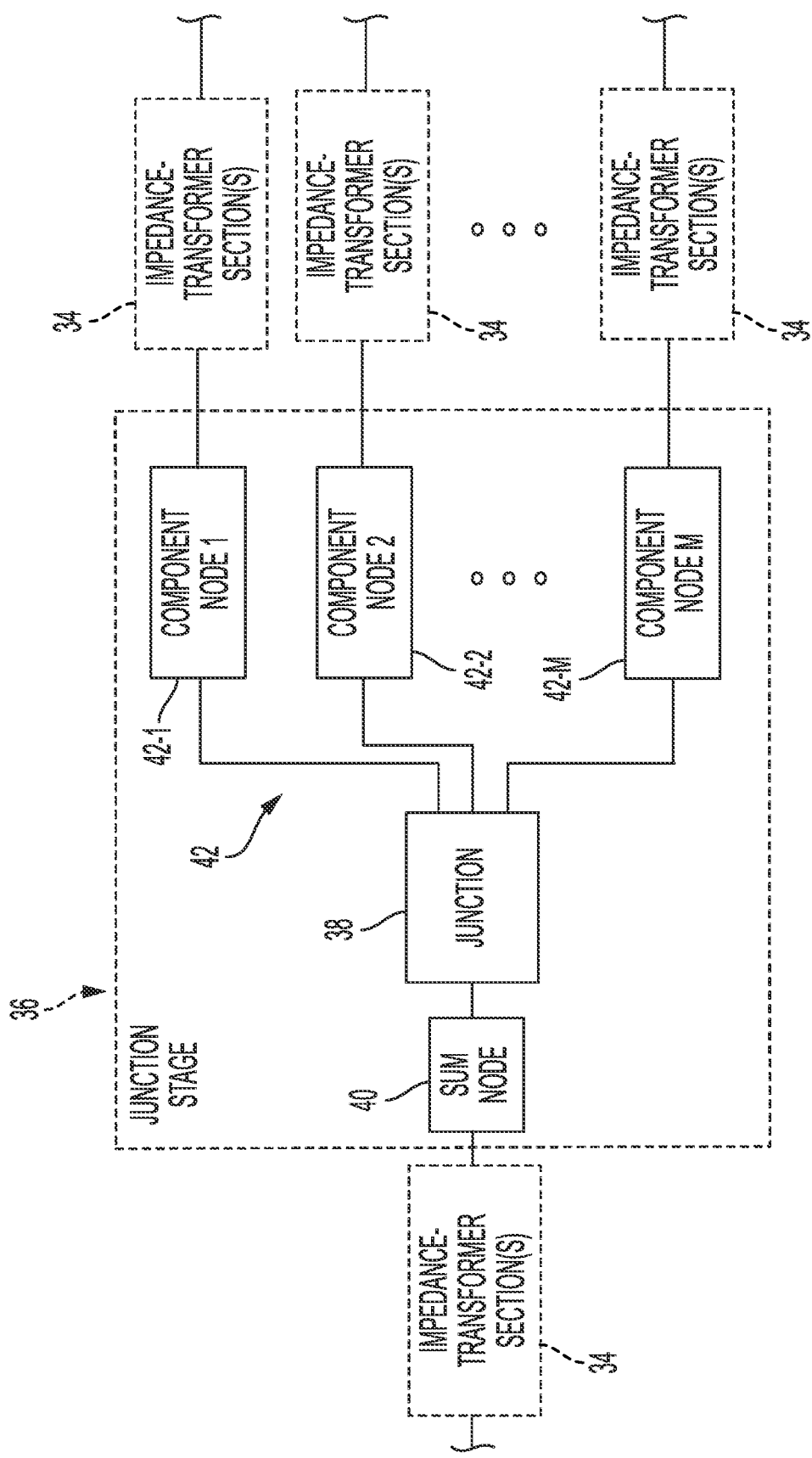
FIG. 2 is a block diagram illustrating the general form of an M-way single-stage junction in a junction network of the combiner/divider of FIG. 1.

FIG. 2 illustrates a junction stage 36 that may be an example of a junction network 26 having a single stage, or a junction stage included in an example of junction network 26 having more than one stage.

Junction stage 36 includes a junction 38 that couples a junction sum node 40 to a plurality of M junction component nodes 42. M is an integer that equals N if junction network 26 has only a single stage. If junction network 26 has two or more junction stages, then M is less than N. In this example, component nodes 42 includes component nodes 1 (42-1), component node 2 (42-2), and where M is greater than 2, then also additional component nodes including final component node M (42-M).

Depending on the configuration of the junction network, sum node 40 may be connected to one or more impedance-transformer sections 34 and each component node 42 may be connected to one or more impedance-transformer sections 34.

Example 2

Figure 3:
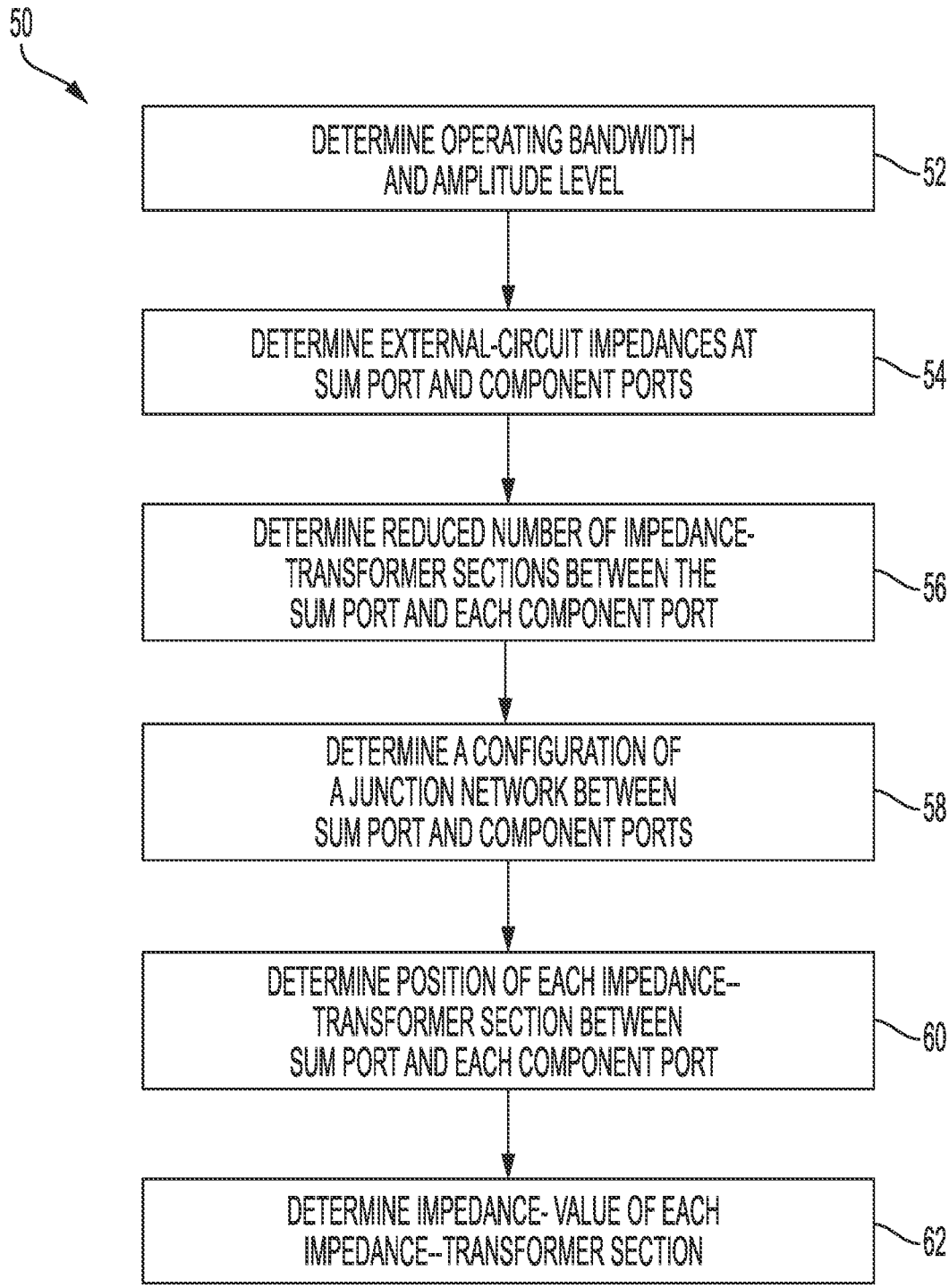
FIG. 3 is flow chart of an exemplary method of designing the impedance-transforming combiner/divider of FIG. 1.

FIG. 3 is a flow chart of an exemplary method 50 of making the impedance-transforming combiner/divider 20 of FIG. 1. Aspects of combiner/dividers described above or below may be utilized in the method steps described below. Where appropriate, reference may be made to previously or subsequently described components and systems that may be used in carrying out each step. These references are for illustration, and are not intended to limit the possible ways of carrying out any particular step of the method.

FIG. 3 illustrates operations in the form of steps performed for designing and making an impedance transforming combiner/divider, and may not recite the complete process or all steps of the method. FIG. 3 depicts multiple steps of method 50, which may be performed in preparation for manufacturing an example of a combiner/divider 20. Although various steps of method 50 are described below and depicted in FIG. 3, the steps need not necessarily all be performed, and in some cases may be performed in a different order than the order shown.

At step 52, a desired operating bandwidth and insertion-loss variation of the combiner/divider are determined. Insertion-loss variation may be determined by determining a value or range of values for a signal transmission attribute other than insertion loss. A first external-circuit impedance of a first external circuit to which a sum port of the combiner/divider is to be connected is determined at step 54. Additionally, a determination is made of a respective second external-circuit impedance of a respective second external circuit to which each of a plurality of component ports is to be connected.

At step 56, a determination is made of a number of impedance transformer sections to have between the sum port and each of the component ports. A number ZT is selected that is greater than one and provide impedance transformation between the first external-circuit impedance and one of the second external-circuit impedances over the operating bandwidth of the combiner/divider. Preferably, the number ZT is at least the lowest number of impedance-transformer sections that provide impedance transformation between the first external-circuit impedance and each second external-circuit impedance over the operating bandwidth of the combiner/divider. This may be thought of as the number of impedance-transformer sections that provides the set bandwidth and insertion-loss variation for a single impedance transformer 28 between the sum port and the component ports. Additional impedance-transformer sections increase the group delay of the combiner/divider and also increase thermal energy produced and add signal losses.

However, improved combiner/divider performance may be realized by having a number ZT of impedance-transformer sections that is an integer that is less than the number of sections that would be required to have one impedance transformer between the sum port and the junction and another impedance transformer between the junction and the component ports. In other words, it is beneficial to have a number ZT of impedance-transformer sections that are less than two times the lowest number of quarter-wavelength impedance-transformer sections that will provide impedance transformation between the first external-circuit impedance and one of the second external-circuit impedances over the operating bandwidth, treating the combiner/divider as a single impedance transformer.

In an ideal design, a sum port input signal would appear as identical voltage signals of the same phase at the N component ports. Applying the law of superposition, the N component ports of identical voltage and phase may be paralleled, resulting in a single port having an impedance of 1/N times the port impedance. From this perspective, the N-way divider/combiner becomes a single impedance transformer. Connecting N ports to a single junction would be physically difficult for a high value of N, with severe power and technology limitations. However, there is a large body of transformer design techniques available, and the disposition of the junctions of the component ports can be distributed within the impedance transformer. For example, a 500 Watt combiner might begin in waveguide or large coaxial line, transitioning to more compact, but lower power, stripline construction near the component junction ports.

Significant performance improvements are realized by having a number ZT that is less than 1.2 times the lowest number of impedance-transformer sections that provide impedance transformation between the first external-circuit impedance and each second external-circuit impedance over the operating bandwidth of the combiner/divider. It will be appreciated that the number ZT is preferably at least and most preferably equal to the lowest number of impedance-transformer sections that provide impedance transformation between the first external-circuit impedance and each second external-circuit impedance over the operating bandwidth of the combiner/divider.

At step 58, a determination is made of a configuration of a junction network electrically connecting a junction-network sum node to each of a plurality of junction-network component nodes. Depending on the operating bandwidth, insertion-loss variation, number of component ports, and impedances being transformed, the number and configuration of junction stages is determined.

In some examples, this may include determining a configuration of first and second junction stages. The first junction stage includes a first-stage junction having a first-stage sum node that is the junction-network sum node and a plurality of first-stage component nodes. The second junction stage then includes a plurality of second-stage junctions each having a second-stage sum node connected to a respective one of the plurality of first-stage component nodes. A plurality of second-stage component nodes are each connected to a respective one of the plurality of junction-network component nodes.

At step 60, a determination is made of the position of each of the ZT impedance-transformer sections distributed in series between the sum port and each of the component ports by way of the junction network while constraining to ZT the number of impedance-transformer sections between the sum port and each of the component ports. More benefits of this method are realized for combiner/dividers that are complex enough to warrant an impedance transformer on the sum signal line and an impedance transformer on each of the component signal lines using conventional design methodology. Accordingly, the junction-network sum node is preferably connected to the sum port through at least a first impedance-transformer section of the ZT impedance-transformer sections and each junction-network component node is preferably connected to a respective one of the component ports through at least a respective second impedance-transformer section of the ZT impedance-transformer sections.

In such a two or more stage junction network, at least a third impedance-transformer section may be assigned between each first component node and the respective second sum node to which the first component node is connected.

At step 62, a determination is made of an impedance value of each of the impedance-transformer sections. In some examples a determination is made of a complex first junction impedance at a first junction of a first junction stage toward the sum port and a complex second junction impedance at the first junction toward the component ports. The imaginary part of the first junction impedance is preferably a conjugate of the imaginary part of the second junction impedance. Correspondingly, a determination is preferably made of the imaginary part of the first junction impedance that varies from a low end of the operating bandwidth to a high end of the operating bandwidth in a first direction and the imaginary part of the second junction impedance that varies from the low end of the operating bandwidth to the high end of the operating bandwidth in a second direction that is opposite to the first direction. In such a configuration the imaginary parts of the impedances offset each other over the operating bandwidth. This allows the impedances at the junction to have imaginary parts that are non-zero and not constrained to any particular value. A combiner/divider may then be manufactured according to the design.

As has been mentioned, design of an impedance transforming combiner/divider is a computationally complex process. Steps 56, 58, 60, and 62 are preferably performed together because they are interrelated. The design procedure is further complicated because both portions (before and after the junction) are intimately simulated together as a single circuit. The computational power required to simulate the whole structure is thus increased considerably. Commercial computer programs are available for designing, simulating, and analyzing such microwave systems, such as AWR Design Environment® software platform available from Cadence Design Systems, Inc. of San Jose, Calif. and CST MICROWAVE STUDIO electromagnetic field simulation software available from Dassault Systèmes of Framingham, Mass.

Figure 4:
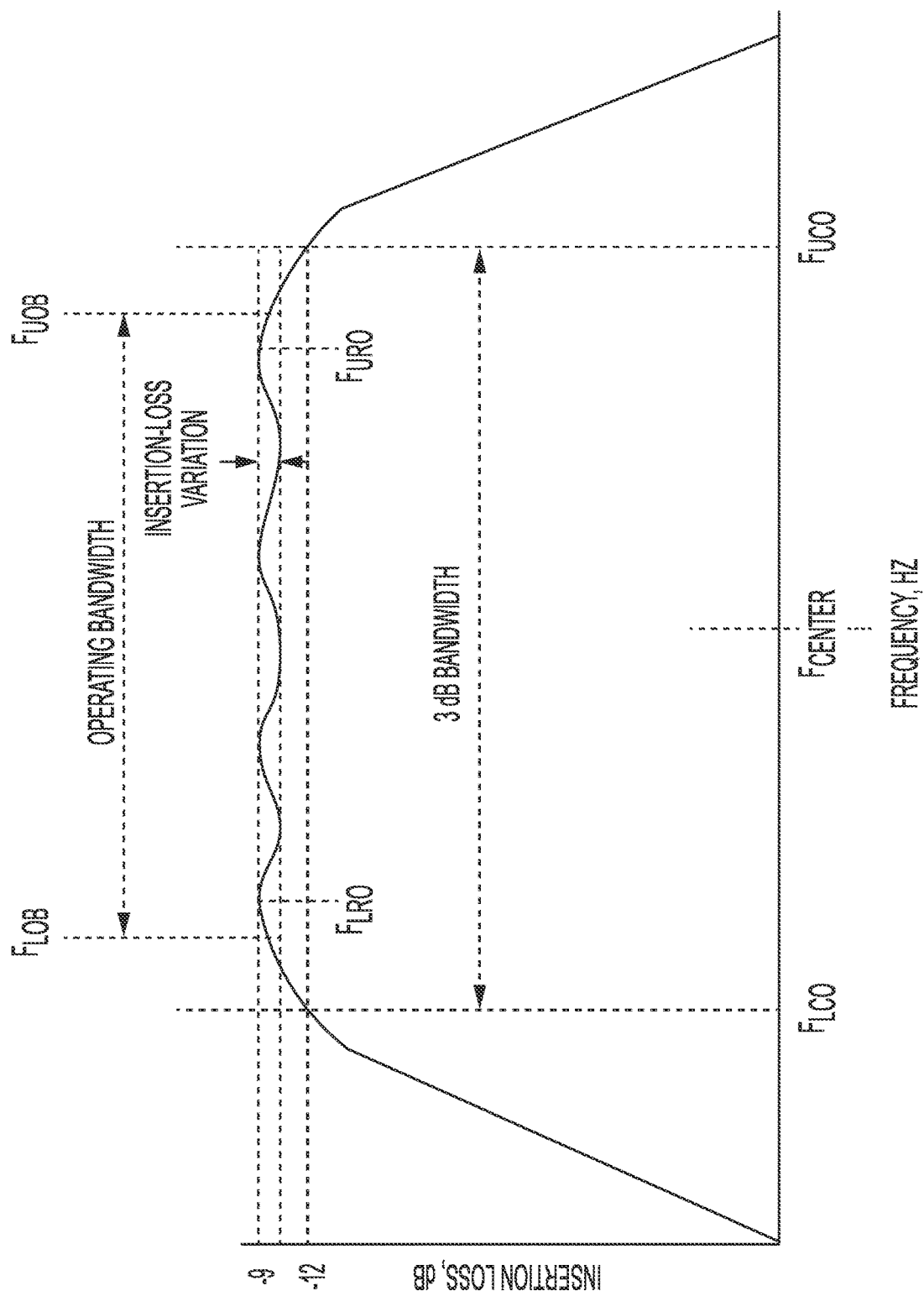
FIG. 4 is a representative simplified chart of a frequency response of a band-pass filter illustrating terminology related to bandwidth.

FIG. 4 is a simplified chart of frequency response of an exemplary bandpass filter that illustrates terminology used in defining an operating bandwidth of a device. A combiner/divider functions as a bandpass filter in the sense that it passes frequencies within a certain range and rejects frequencies outside of that range.

As used herein, cutoff frequencies for a device are an upper cutoff frequency ($F_{UCO}$) and lower cutoff frequency ($F_{LCO}$) where the insertion loss is 3 dB above (and the power level is 3 dB below) the highest level between these band-limiting cutoff frequencies. A common definition of bandwidth is the difference between the upper cutoff frequency and lower cutoff frequency and is referred to herein as the 3 dB bandwidth. The power level decreases and the insertion loss increases monotonically above the upper cutoff frequency and below the lower cutoff frequency. Since many applications of combiners/dividers require performance to be much more stringent than 3 dB, the term operating bandwidth is used to define a bandwidth of increased stringency that is within the 3 dB bandwidth. The 3 dB bandwidth is useful, though, in defining the operating bandwidth.

The center frequency ($F_{CENTER}$) is the frequency that is half way between the lower cutoff frequency ($F_{LCO}$) and the upper cutoff frequency ($F_{UCO}$). The lower roll-off frequency ($F_{LRO}$) is the frequency below which the insertion loss decreases monotonically to the lower cutoff frequency ($F_{LCO}$). The upper roll-off frequency ($F_{URO}$) is the frequency above which the insertion loss increases and the transmitted power level decreases monotonically to the upper cutoff frequency ($F_{UCO}$). The insertion-loss variation is then the amount of variation in the insertion loss level over the frequency band between the lower and upper roll-off frequencies. The lower operating-band frequency ($F_{LOB}$) and upper operating-band frequency ($F_{UOB}$) are the frequencies between which the insertion loss is within the insertion-loss variation. Accordingly, the operating bandwidth is the range of frequencies between the upper operating-band frequency ($F_{UOB}$) and lower operating-band frequency ($F_{LOB}$).

Example 3

Figure 5:
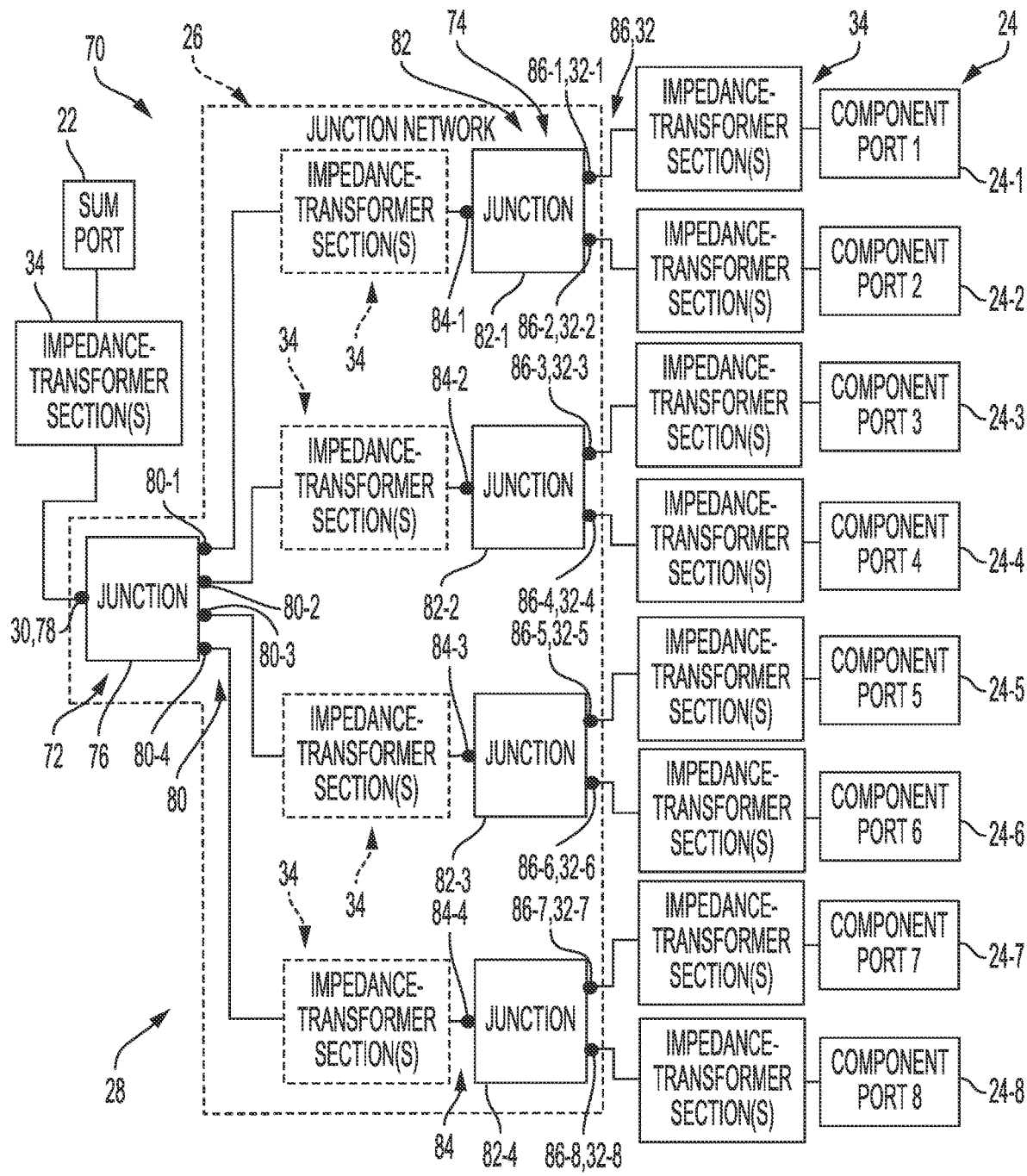
FIG. 5 is a block diagram of an example of an 8-way combiner/divider according to FIG. 1 having a two-stage junction network.

FIG. 5 is a block diagram illustrating an exemplary 8-way combiner/divider 70. Combiner/divider 70 is an example of a combiner/divider 20 shown in FIG. 1. Reference numbers for like elements that have previously been described are applied for ease of understanding. Combiner/divider 70 includes a sum port 22, eight component ports 24, a junction network 26, and an impedance transformer 28. Impedance transformer 28 includes ZT quarter-wavelength impedance-transformer sections 34 distributed in series between sum port 22 and each of the eight component ports 24 by way of junction network 26. Sum port 22 is configured to be connected to a first external circuit (not shown) having a first external-circuit impedance. Component ports 24 are each configured to be attached to a respective second external circuit (not shown) having a respective second external-circuit impedance. Component ports 24 include component ports 24-1, 24-2, 24-3, 24-4, 24-5, 24-6, 24-7, and 24-8.

Junction network 26 includes and electrically connects a junction-network sum node 30 to each of 8 junction-network component nodes 32, including junction-network component nodes 32-1, 32-2, 32-3, 32-4, 32-5, 32-6, 32-7, and 32-8. Junction-network sum node 30 is connected to sum port 22 through one or more impedance-transformer section 34. Similarly, junction-network component nodes 32-1, 32-2, 32-3, 32-4, 32-5, 32-6, 32-7, and 32-8 are connected respectively to component ports 24-1, 24-2, 24-3, 24-4, 24-5, 24-6, 24-7, and 24-8 through one or more respective impedance-transformer sections 34.

In this example, junction network 26 is a two-stage network that includes a first junction stage 72 and a second junction stage 74. First junction stage 72, as an example of a junction stage 36, includes a four-way junction 76, as an example of junction 38, that couples a junction sum node 78, which is also junction-network sum node 30, to four junction component nodes 80. Junction component nodes 80 include junction component nodes 80-1, 80-2, 80-3, and 80-4.

Second junction stage 74 includes four two-way junctions 82, including junctions 82-1, 82-2, 82-3, and 82-4, that are further examples of junction 38. Each junction 82 includes a respective junction sum node 84, including sum nodes 84-1, 84-2, 84-3, and 84-4. Junctions 82-1, 82-2, 82-3, and 82-4 couple each sum node 84-1, 84-2, 84-3, and 84-4 to respective junction component nodes 86. Component nodes 86 include component nodes 86-1, 86-2 for junction 82-1; component nodes 86-3, 86-4 for junction 82-2; component nodes 86-5, 86-6 for junction 82-3; and component nodes 86-7, 86-8 for junction 82-4.

Second-stage junction sum nodes 84-1, 84-2, 84-3, and 84-4 are connected to respective first-stage component nodes 80-1, 80-2, 80-3, and 80-4. There may be one or more impedance transformer sections 34 between the component nodes of a preceding stage junction and sum nodes of a succeeding stage. Component nodes 80-1, 80-2, 80-3, and 80-4 of first junction stage 72 may be connected to sum nodes 84-1, 84-2, 84-3, and 84-4 of second junction stage 74 through one or more respective impedance-transformer sections 34.

As discussed above, impedance transformer 28 includes ZT quarter-wavelength impedance-transformer sections 34 distributed in series between sum port 22 and each of the eight component ports 24 by way of junction network 26. The number ZT is an integer greater than one and is less than two times the lowest number of impedance-transformer sections that provide impedance transformation between the first external-circuit impedance and each second external-circuit impedance over the determined operating bandwidth of the combiner/divider. The number ZT is preferably at least and most preferably equal to the lowest number of impedance-transformer sections that provide impedance transformation between the first external-circuit impedance and each second external-circuit impedance over the operating bandwidth of the combiner/divider.

Impedance-transformer sections 34 transform impedance between the first external-circuit impedance of sum port 22 and the respective second external-circuit impedance of each of component ports 24. Impedance transformer 28 thus includes the configuration of all of the impedance transformer sections between the sum port and the eight component ports and may include one or more of junctions 76 and junctions 82 if the junctions provide impedance transformation. The plurality of impedance transforming sections may all be of the same type of transmission line or include different types. For example, an impedance-transformer section may be a waveguide, a coaxial transmission line, a slotline, a stripline, a microstrip, or a coplanar waveguide.

Example 4

FIGS. 6-12 illustrate various features of a specific example of an eight-way combiner/divider 90, which is a further detailed example of the combiner/dividers 20 and 70. Combiner/divider 90 provides signal transmission over an operating bandwidth of 2.0 GHz to 18.0 GHz. The insertion-loss variation is +/−0.5 dB. The Voltage Standing Wave Ratio (VSWR) is 1.45:1. The phase variation is +/−8 degrees. The combiner/divider has 0.9 dB dissipative loss while conducting up to 350 watts of continuous power.

Figure 6:
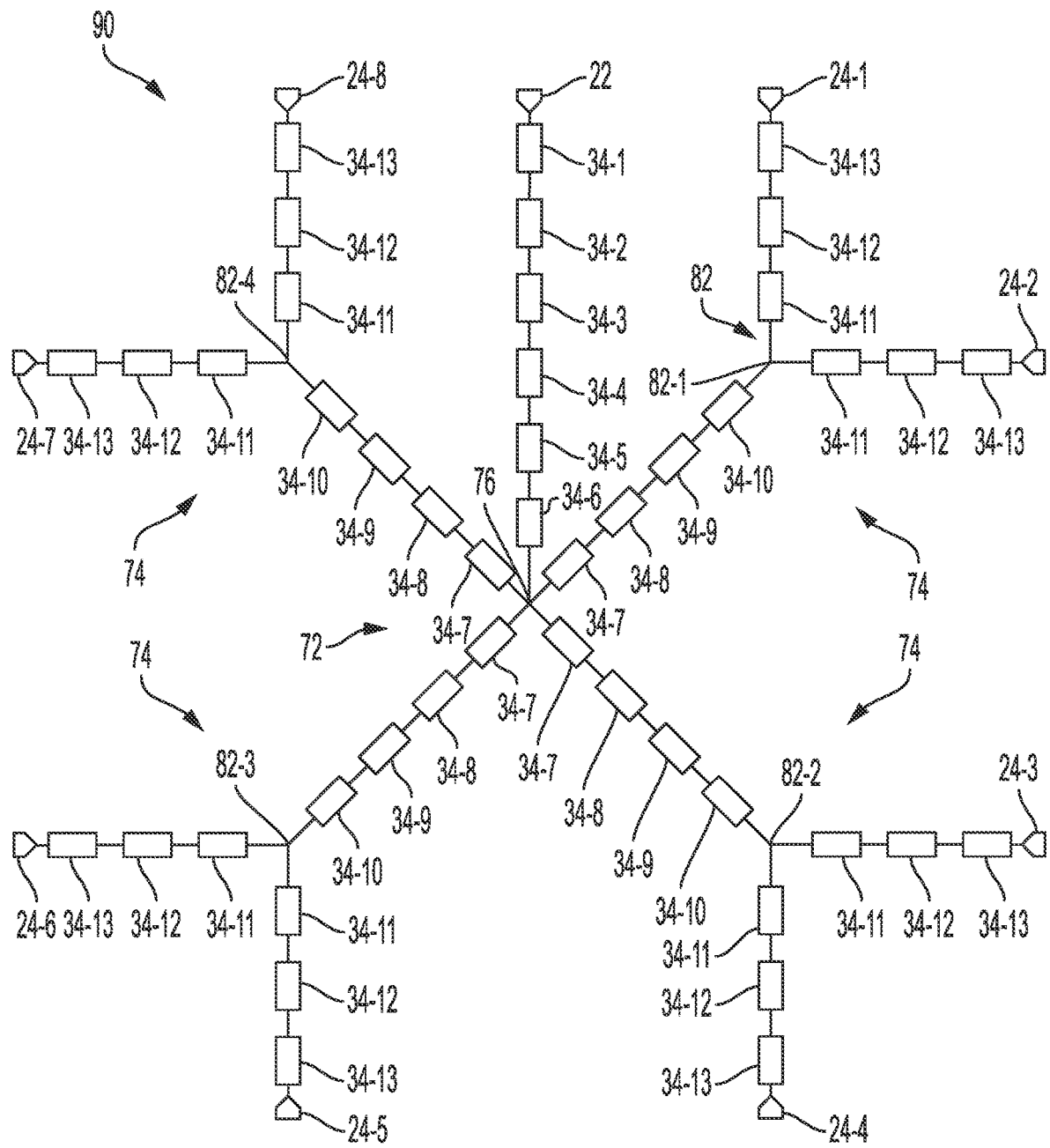
FIG. 6 is a simplified schematic of a further detailed example of the combiner/divider of FIG. 5 showing impedance transforming sections.

FIG. 6 is a simplified schematic showing quarter-wavelength impedance transforming sections in the configuration illustrated for combiner/divider 70. Reference numbers for like elements that have previously been described are applied for ease of understanding.

In particular, combiner/divider 90 includes sum port 22, eight component ports 24, junction network 26, and impedance transformer 28. Sum port 22 is configured to be connected to a first external circuit (not shown) having a first external-circuit impedance of 50 ohms. Component ports 24 are each configured to be attached to a respective second external circuit (not shown) having a respective second external-circuit impedance also of 50 ohms. Component ports 24 include component ports 24-1, 24-2, 24-3, 24-4, 24-5, 24-6, 24-7, and 24-8.

Junction network 26 includes first junction stage 72 and second junction stage 74. First junction stage 72 includes four-way junction 76. Second junction stage 74 includes four two-way junctions 82, including junctions 82-1, 82-2, 82-3, and 82-4.

Impedance transformer 28 includes 13 quarter-wavelength impedance-transformer sections 34 distributed in series between sum port 22 and each of the eight component ports 24 by way of junction network 26. The number 13 is the lowest number of impedance-transformer sections that provide impedance transformation between the first external-circuit impedance and each second external-circuit impedance over the operating bandwidth of the combiner/divider.

Impedance-transformer sections 34 include impedance-transformer sections 34-1 through 34-13, as shown. The impedance values for the impedance-transformer sections are as follows:

| | |
|---|---|
| 34-1 | 45.34 ohms |
| 34-2 | 41.33 ohms |
| 34-3 | 36.53 ohms |
| 34-4 | 31.33 ohms |
| 34-5 | 26.19 ohms |
| 34-6 | 21.51 ohms |
| 34-7 | 54.05 ohms |
| 34-8 | 48.93 ohms |
| 34-9 | 43.73 ohms |
| 34-10 | 38.83 ohms |
| 34-11 | 68.96 ohms |
| 34-12 | 61.63 ohms |
| 34-13 | 55.78 ohms |

Figure 7:
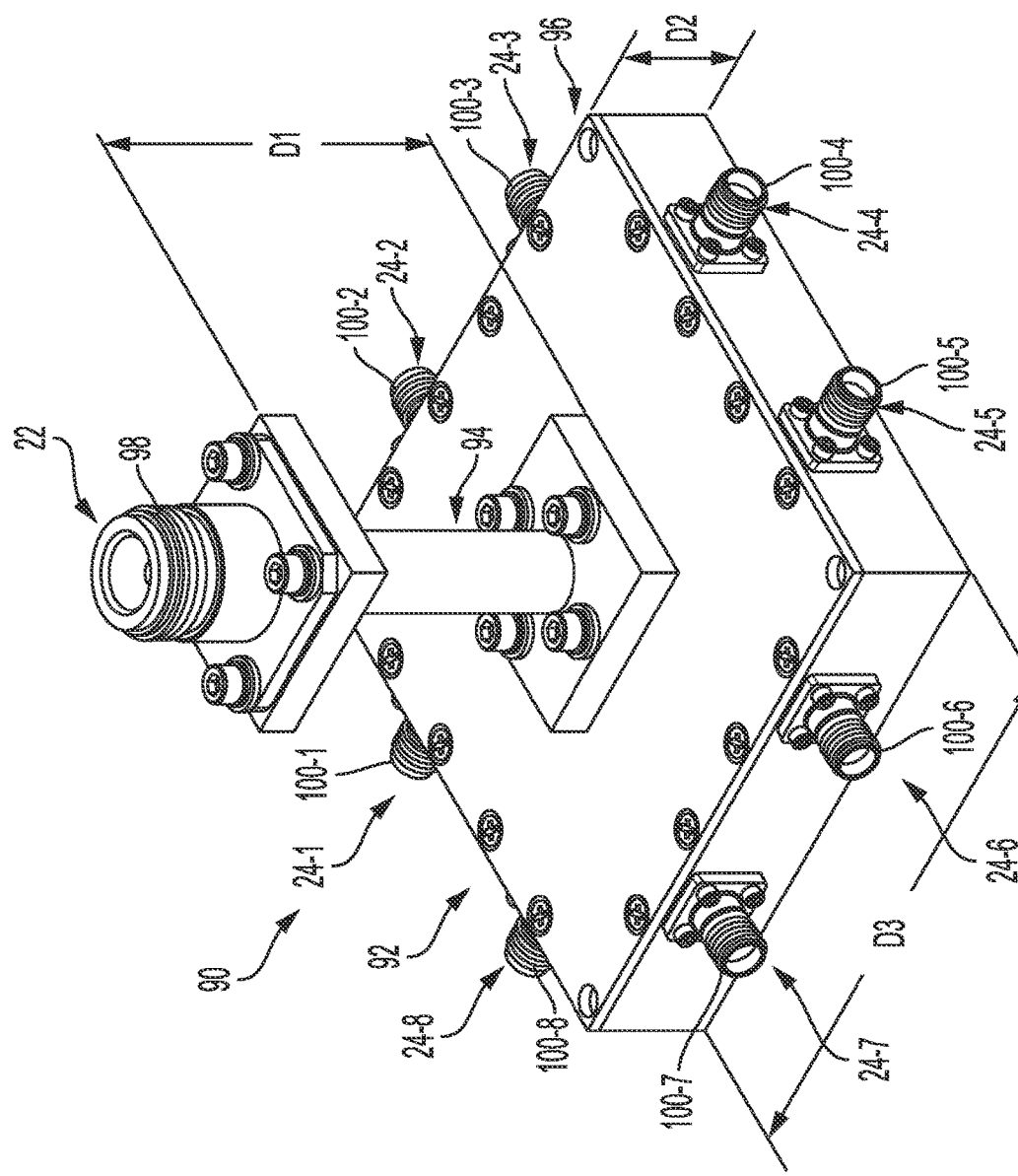
FIG. 7 is an isometric view of an embodiment of the combiner/divider of FIG. 6.

FIG. 7 is an isometric view of an embodiment of eight-way combiner/divider 90 showing a housing 92 including a coaxial section 94 having a physical length D1, and a square base section 96 having sides with a height D2 and width D3. Coaxial section 94 extends perpendicularly from the center of a broad face on base section 96, houses six impedance-transformer sections 34 as illustrated in FIG. 6, and is terminated at sum port 22 in the form of a coaxial connector 98.

Base section 96 has a square shape in a plane perpendicular to the length of coaxial section 94. The base section encloses the remaining impedance-transformer sections as well as junction network 26. Component ports 24-1 through 24-8 are distributed around four side faces of the base section in the form of respective coaxial connectors 100-1 through 100-8, as shown.

Figure 8:
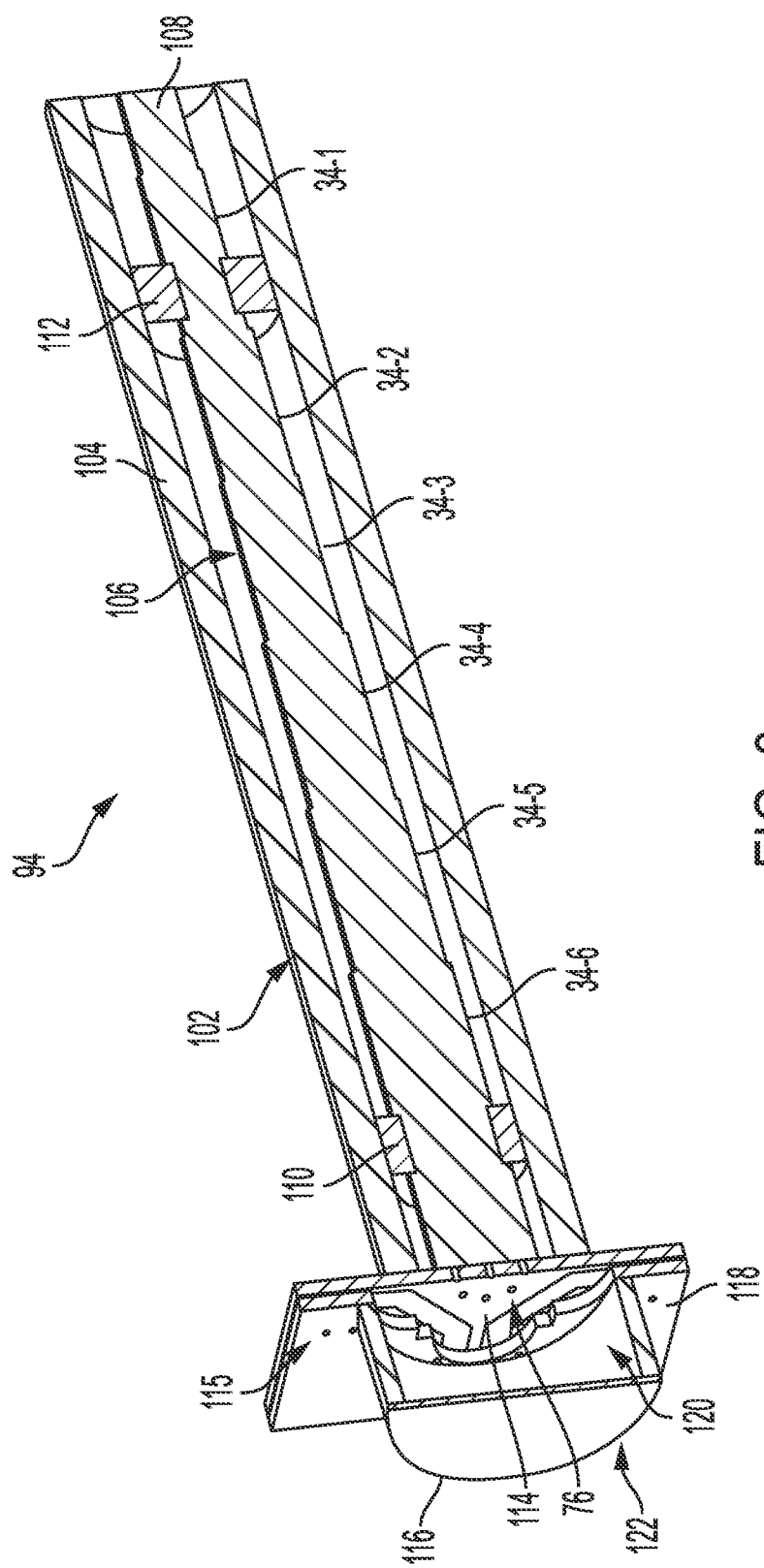
FIG. 8 is an isometric cross-section taken along a center line of a coaxial sum transmission line illustrating impedance transforming sections.

FIG. 8 is an isometric cross-section taken along a center line of a coaxial sum transmission line 102 contained in coaxial section 94. Transmission line 102 includes an outer conductor 104 and a center conductor 106 having the impedances of impedance-transformer sections 34-1 through 34-6. Impedance-transformer section 34-1 is connected to a 50-ohm terminal impedance section 108 connected to coaxial connector 98 (not shown in FIG. 8). Rings 110 and 112 support center conductor 106 in spaced relationship to outer conductor 104 and are made of a suitable dielectric material, such as polytetrafluoroethylene (PTFE) commonly known by the proprietary name Teflon® sold by Chemours Company FC, LLC of Wilmington, Del.

Impedance-transformer section 34-6 is connected to a conductive square plate 114 positioned perpendicular to the length of the coaxial section and functioning as four-way junction 76. In FIGS. 8-12, connections between conductive layers are provided by suitable vias collectively and individually identified by reference 115, as is well known. A hollow round housing 116 with a closed end mounted to a ground plane 118 has a cavity 120 that is open to plate 114 and serves as a waveguide backshort 122.

Figure 9:
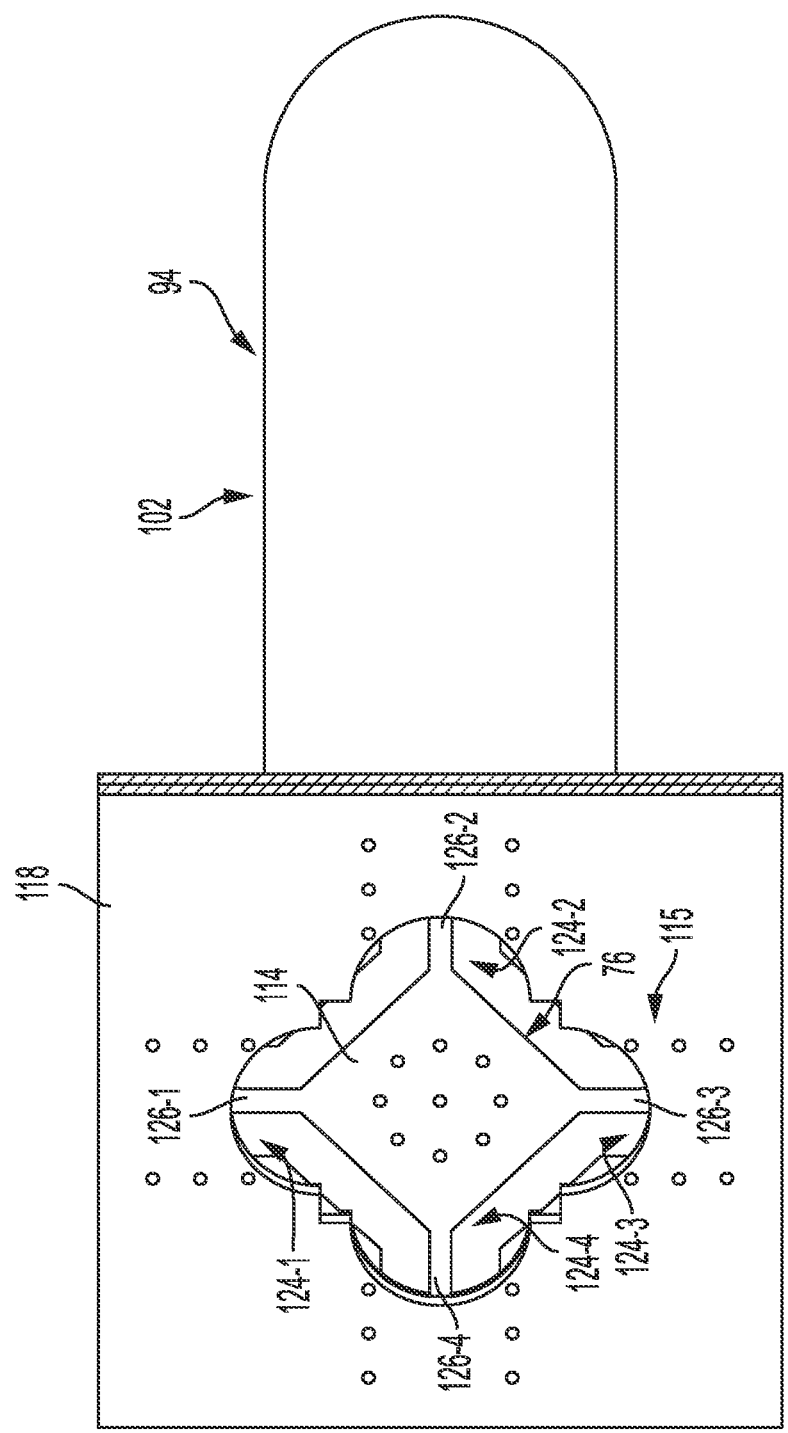
FIG. 9 is an isometric end view of a 4-way junction to which the coaxial sum transmission line of FIG. 8 is connected.

FIG. 9 is an isometric end view of coaxial section 94 illustrating in further detail 4-way junction 76 to which the coaxial sum transmission line 102 of FIG. 8 is connected. Transition plate 114 is connected to four stripline transmission lines 124-1, 124-2, 124-3, and 124-4 having respective signal conductors 126-1, 126-2, 126-3, and 126-4.

Figure 10:
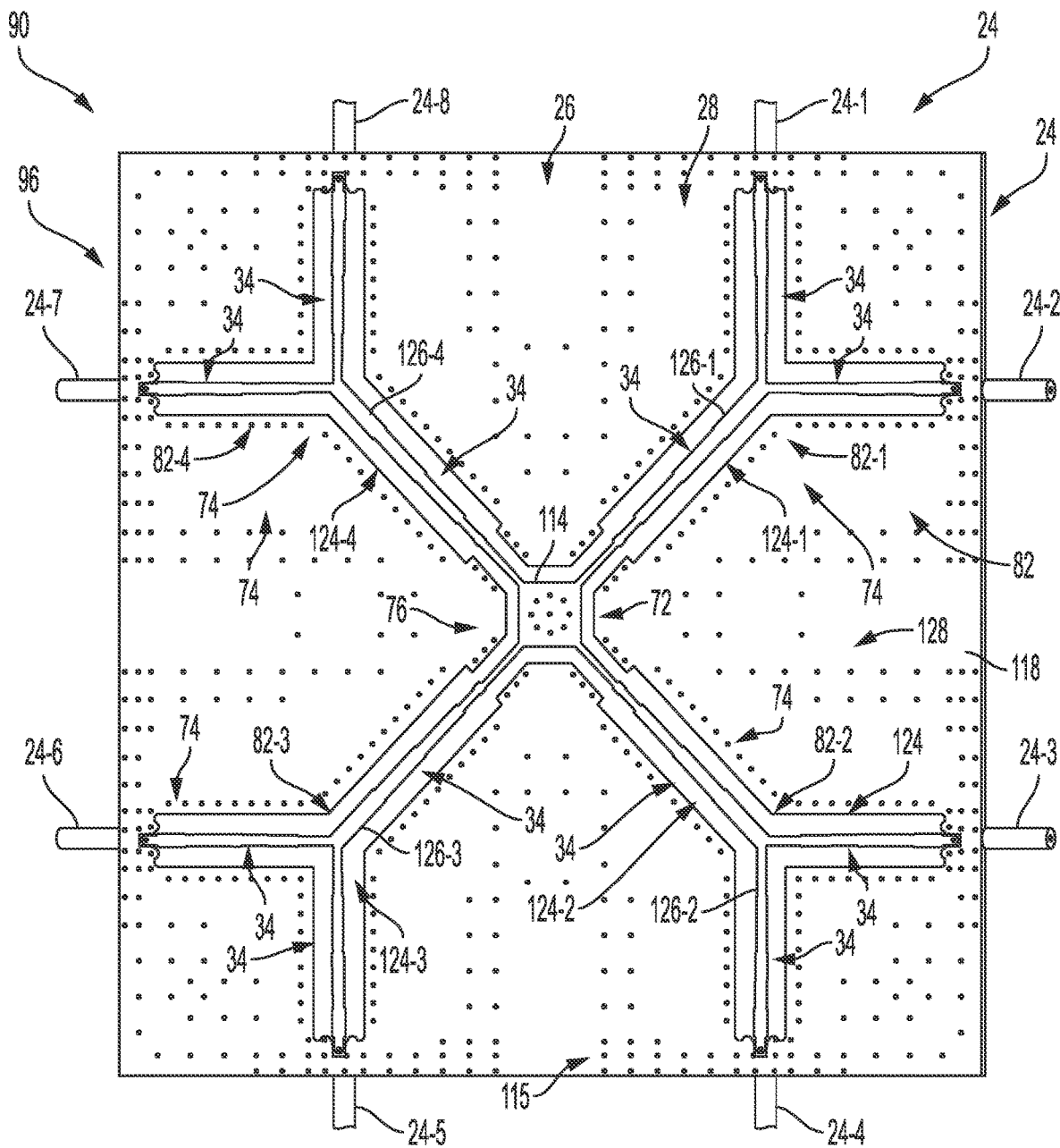
FIG. 10 is a plan view of a stripline network of the 8-way combiner of FIG. 7 showing the 4-way junction and 2-way junctions with impedance transforming sections.

FIG. 10 is a plan view of a stripline network 128 of the 8-way combiner of FIG. 7 showing junction network 26, including four-way junction 76 and two-way junctions 82-1 through 82-4, with impedance transforming sections 34 of impedance transformer 28. Stripline network 128 includes the impedance-transformer sections 34 between four-way junction 76 and two-way junctions 82 component ports 24-1 through 24-8, and impedance-transformer sections 34 between two-way junctions 82 and component ports 24.

Figure 11:
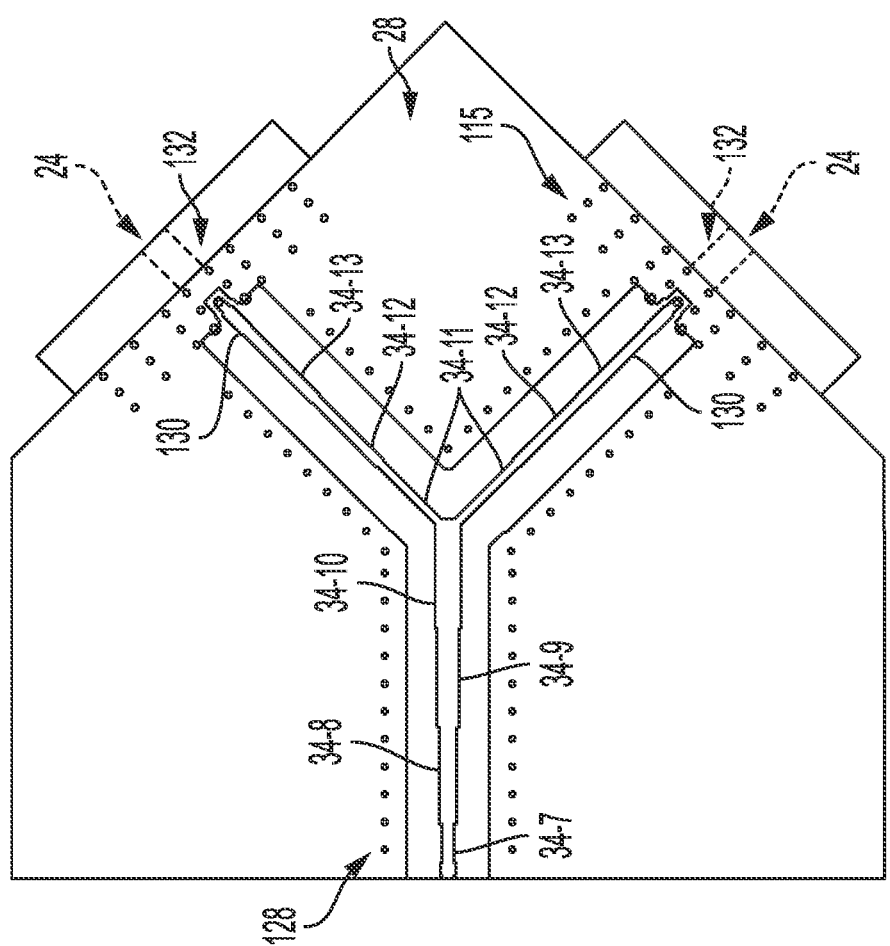
FIG. 11 is a plan view of one of the 2-way junctions of FIG. 10.

The configuration of stripline network 128 along one of the four signal conductors 126 of a stripline 124 emanating from four-way plate 114 of four-way junction 76 is illustrated in FIG. 11. FIG. 11 is thus an enlarged plan view of a representative one of the two-way junctions 82 shown in FIG. 10. It will be appreciated, then, that as shown in FIG. 10, stripline network 128 includes four circuits having the configuration shown in FIG. 11.

FIG. 11 illustrates the locations of impedance-transformer sections 34-7 through 34-13. Each final impedance-transformer section 34-13 is connected to a 50-ohm stripline terminal section 130 that forms part of a transmission-line transition structure 132.

Figure 12:
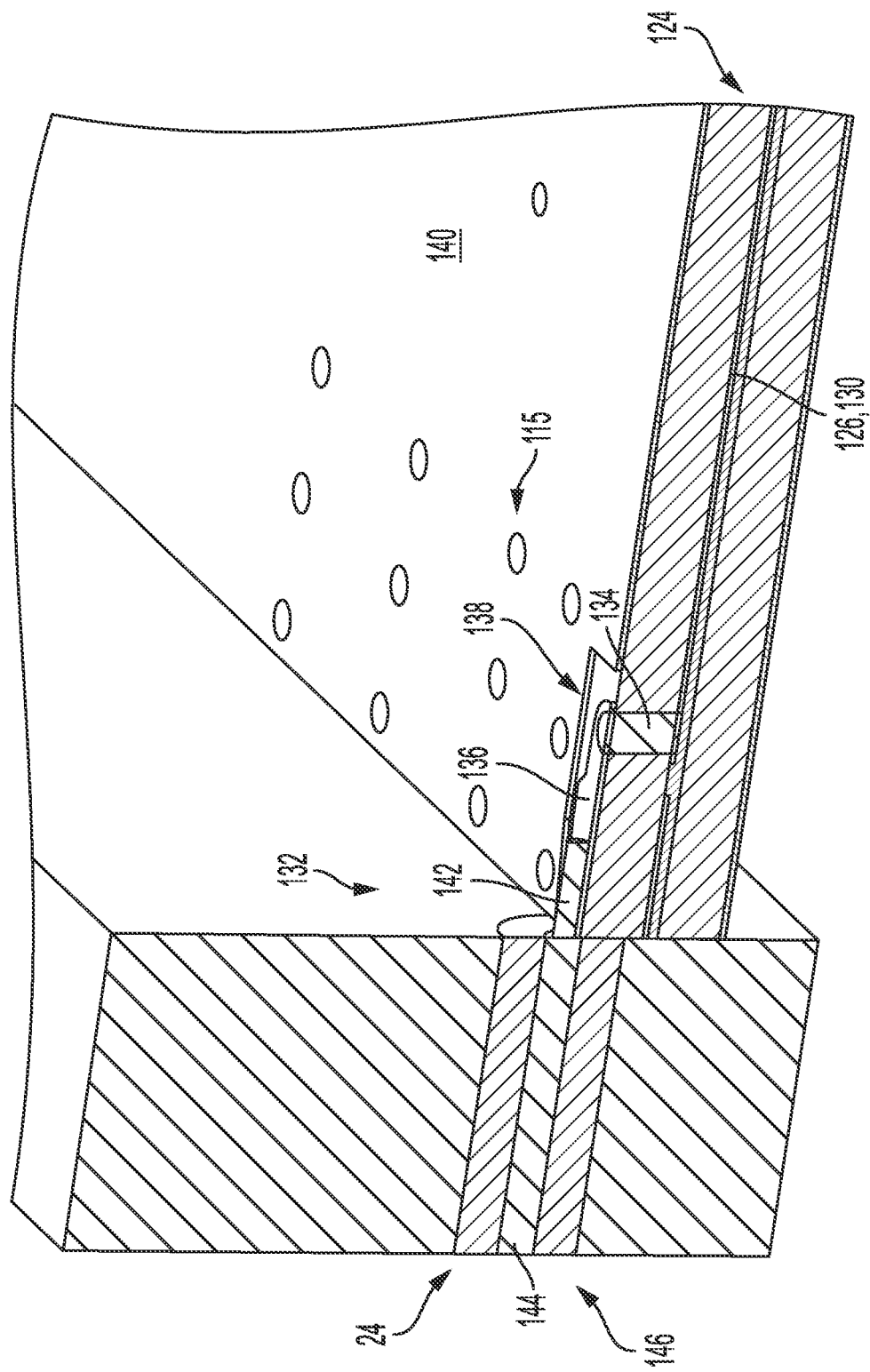
FIG. 12 is an isometric cross-section showing a transmission-line transition structure that transitions the transmission-line type from stripline to coaxial line at a component port of a component signal line of the 8-way combiner of FIG. 7.

As shown in cross section in FIG. 12, transmission-line transition structure 132 provides a transition from the respective stripline 124 to coaxial line at the respective component port 24. A signal-line via 134 extends through a dielectric layer on stripline signal conductor 126 to one end of a short intermediate signal conductor 136 of a coplanar waveguide (CPW) 138. Signal conductor 136 is electrically spaced from a planar ground conductor 140 extending in the same plane to form the CPW transmission line.

The other end of signal conductor 136 is connected to an extension 142 of a center conductor 144 of a coaxial transmission line 146. Although not specifically shown, coaxial transmission line 146 is attached and connected to a coaxial connector 98 as shown in FIG. 7 to form a component port 24.

Figure 13:
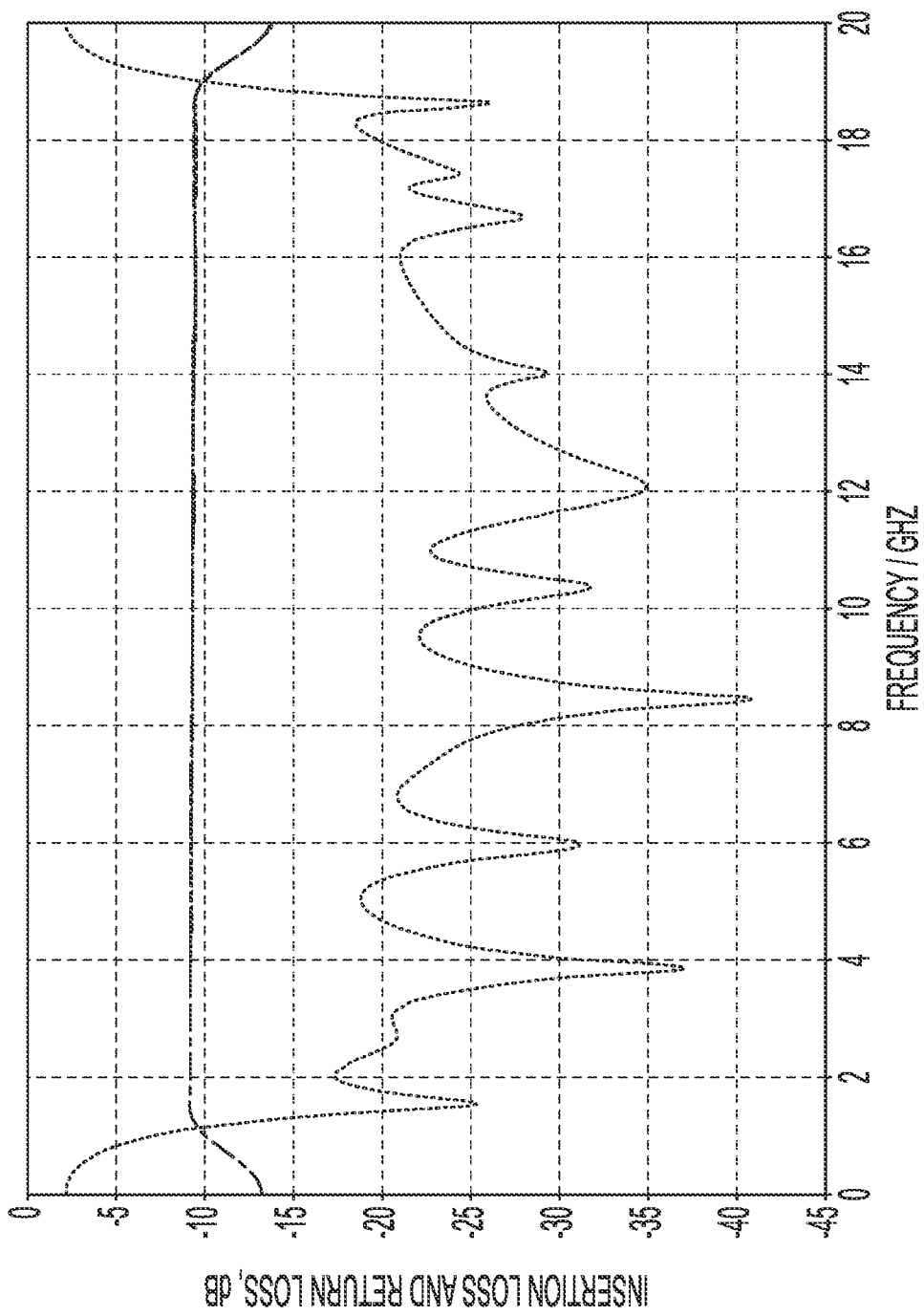
FIG. 13 is a chart showing relative power level, and thereby insertion loss and return loss, versus frequency for the 8-way combiner/divider of FIG. 7.

FIG. 13 is a chart showing the performance of combiner/divider 90. In particular, relative transmitted and reflected signal power levels are shown as a function of frequency to illustrate insertion loss and return loss. It is seen that for the specified operating bandwidth of 2 GHz to 18 GHz, that the insertion loss between the sum port and each component port is very close to 9 dB, which corresponds to each component port conducting one-eighth of the input power. It is seen that the actual operating bandwidth extends somewhat below 2 GHz and somewhat above 18 GHz. This is consistent with the high level of the return loss over the same frequency range.

Figure 14:
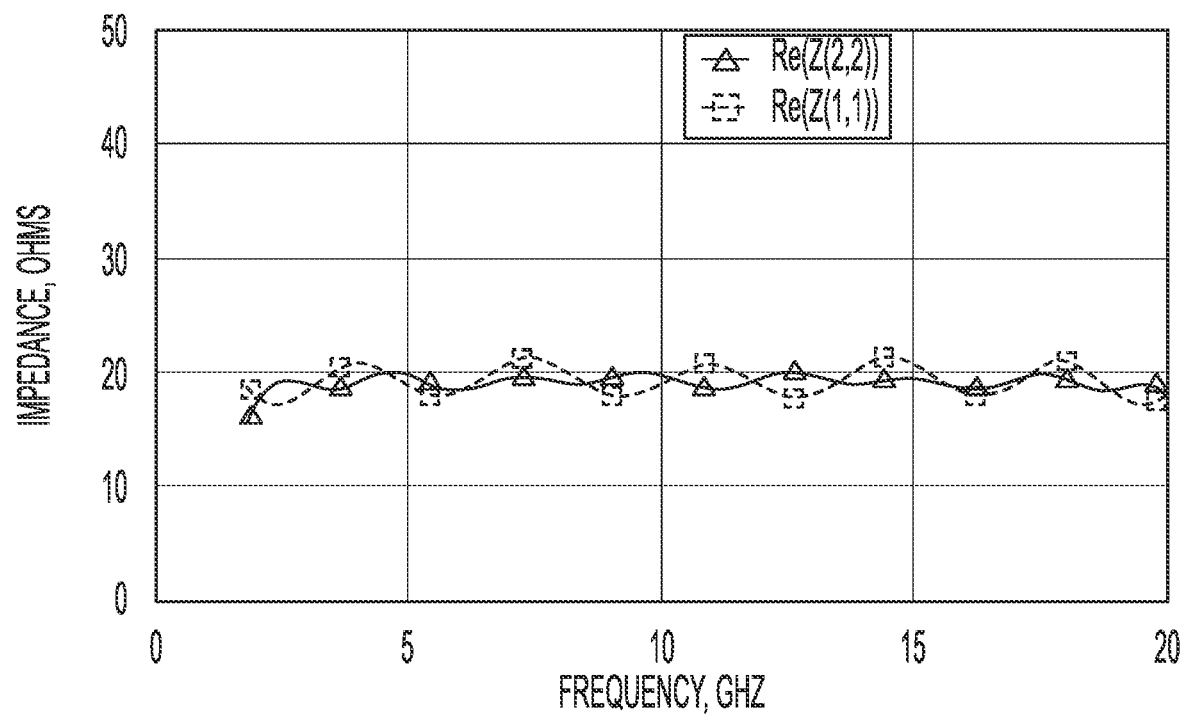
FIG. 14 is a chart showing the real impedance versus frequency at the 4-way junction of the 8-way combiner/divider of FIG. 7.

FIG. 14 is a chart showing the real impedance looking toward the sum port, shown as Re(Z(1, 1)), and looking toward each component port, shown as Re(Z(2,2)) versus frequency at four-way junction 76 of the eight-way combiner/divider 90. It is seen that the real impedances vary somewhat over the frequency range and at any given frequency tend to be offsetting. The result is a net impedance of close to 19 ohms over the operating bandwidth.

Figure 15:
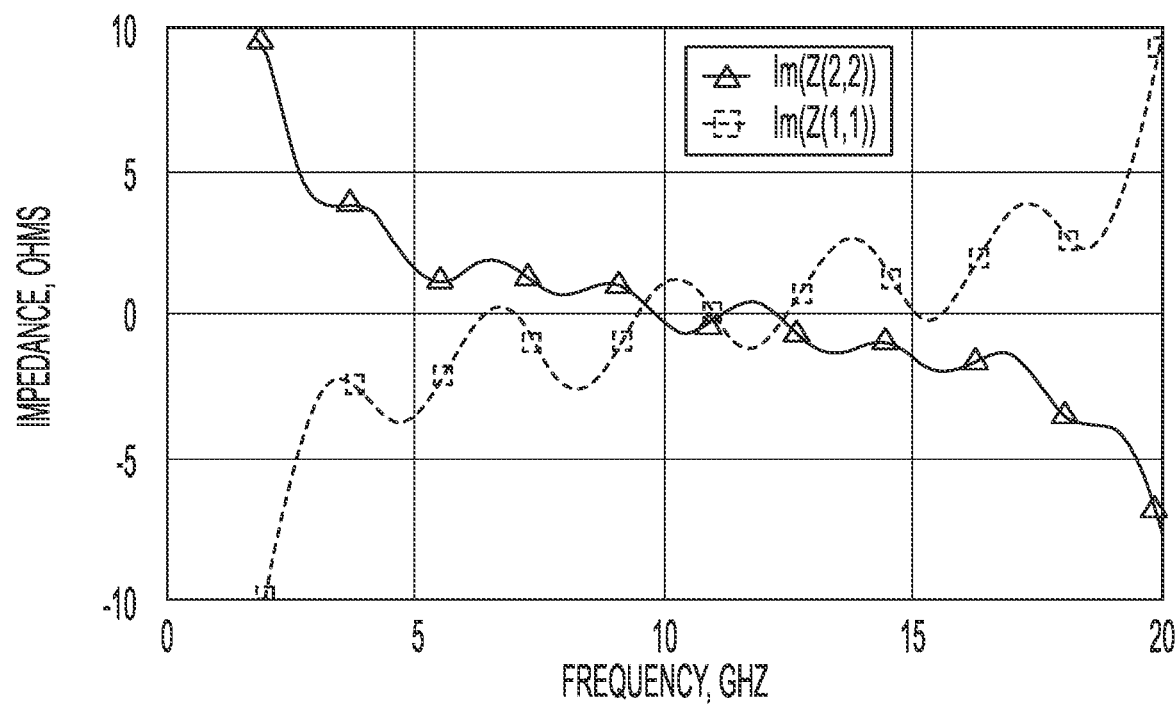
FIG. 15 is a chart showing the imaginary impedance versus frequency at the 4-way junction of the 8-way combiner/divider of FIG. 7.

FIG. 15 is a chart showing the imaginary impedance looking toward the sum port, shown as Im(Z(1, 1)), and looking toward each component port, shown as Im(Z(2,2)) versus frequency also at four-way junction 76. It is seen that the imaginary impedances vary significantly over the operating bandwidth. Each imaginary impedance has a consistent general slope over the operating bandwidth and these slopes tend to be opposite in direction and magnitude. As a result, the imaginary impedances offset each other over the frequency range. This is consistent with the impedances at the junction being conjugates of each other.

The different embodiments of the impedance-transforming combiner/divider described herein provide several advantages over known solutions for transforming impedance between a sum port and the component ports of a combiner/divider. Thus, the illustrative embodiments described herein are particularly useful for combiner/dividers generally, and to radial combiner/dividers in particular. However, not all embodiments described herein provide the same advantages or the same degree of advantage.

As a typical example, the conventional method of designing and building is to match a real 50-ohms to a real impedance at the junction. Stating this another way, the conventional method must zero out the imaginary part at the impedance at the junction over the entire bandwidth of interest. It is the zeroing out of the imaginary part at the junction in the eight-way example that results in the use of 13 sections in the sum line impedance transformer and 13 sections in each of the component line impedance transformers.

As mentioned, the convention is to conveniently break the design into two small pieces, thinking that it simplifies the design process. However, zeroing out the imaginary part of the impedance at the junction has its disadvantages when reduction of physical size and insertion loss are key driving parameters in the design.

Breaking the design into two well-matched transformers leads to another issue. The transformers interact and disturb the frequency response near the edges of the full operating bandwidth. As a result, the design process involves overdesigning on the bandwidth of the component transformers to compensate for undesirable radio-frequency transmission modes. On the other hand, designing the entire combiner/divider as a single transformer, as is described above, results in two parts being cascaded, i.e., the sum part and the component part, that are approximate complex conjugates of each other. It is sufficient then for the resulting single transformer to cover only the required operating bandwidth.

In the above-described method and resulting structure, the imaginary part of the junction impedance is allowed to have a slope over the operating bandwidth and have a non-zero value at the junction. The imaginary parts of the impedances for the sum and component sections are allowed to have opposite slopes and to zero out the imaginary part gradually between the sum and component ports. This approach allows the design to use as few as 13 impedance-transformer sections in the case of combiner/divider 90, while a conventional approach would use 26 sections. The result is that the number of sections per leg can be cut in half and the total physical volume of the combiner/divider reduced by 75%. This, in turn, reduces both insertion loss as well as the size of a thermal heat-sink without affecting the total bandwidth of interest.

A 2-18 GHz eight-way combiner/divider designed and built using the conventional approach of having separate sum and component impedance transformers was found to have a resulting structure that measured 6 in×4.5 in×4.5 in in dimensions and had a junction impedance of 6.25-Ohms. This design caused some moding issues starting at 12 GHz. Moding is a phenomenon in which undesired modes other than the intended TEM mode of transmission start to propagate.

The assembled design of combiner/divider 90 shown above in FIG. 7 has a resulting structure that is 3 in (D1+D2)×3 in (D3)×3 in (D3), which is a 75% reduction in volume compared to the conventional approach. The reduced circuit size and reduced signal-path length provide a simulated insertion loss that is about half that of the conventional design. A further benefit is thus that the combiner/divider can conduct twice the power. Additionally, no moding issue was observed in the simulation results. Also, the heat-sink is less than half in size given the reduced dimensions and insertion loss.

A side benefit of the single-transformer approach, which preferably involves three-dimensional (3D) simulations and layouts, involves the integration of all aspects of the entire combiner. This eliminates any disconnect that may occur in designing two separate transformers and subsequently merging them. Once done with the preparation, the integrated design emerges whole and complete on the culmination of the simulations without any need for further intervention to compensate for the cascading of separate transformers.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and sub-combinations of the various elements, features, functions, and/or properties disclosed herein. The following claims particularly point out certain combinations and sub-combinations regarded as novel and nonobvious. Invention(s) embodied in other combinations and sub-combinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Where "a" or "a first" element or the equivalent thereof is recited, such usage includes one or more such elements, neither requiring nor excluding two or more such elements. Further, ordinal terms, such as first, second, or third, for identified elements are used to distinguish between the elements in the order in which they are introduced in a particular context, and are not intended to show serial or numerical limitation, or be fixed identifiers for the group members. Accordingly, the ordinal indicator used for a particular element may vary in different contexts.

The invention claimed is:

1. An impedance transforming combiner/divider having a determined insertion-loss variation over a determined operating bandwidth comprising:
 a sum port configured to be connected to a first external circuit having a first external-circuit impedance;

N component ports each configured to be attached to a respective second external circuit having a respective second external-circuit impedance, where N is an integer greater than one;

a junction network electrically connecting a junction-network sum node to each of N junction-network component nodes; and ZT quarter-wavelength impedance-transformer sections distributed in series between the sum port and each of the N component ports by way of the junction network, wherein the ZT impedance-transformer sections transform impedance between the first external-circuit impedance of the sum port and the respective second external-circuit impedance of each of the component ports, ZT is an integer greater than one and is less than two times the lowest number of impedance-transformer sections that provide impedance transformation between the first external-circuit impedance and each second external-circuit impedance over the determined operating bandwidth of the combiner/divider for the determined insertion-loss variation, the junction-network sum node is connected to the sum port through at least a first impedance-transformer section of the ZT impedance-transformer sections, each junction-network component node is connected to a respective one of the plurality of component ports through at least a respective second impedance-transformer section of the ZT impedance-transformer sections.

2. The combiner/divider of claim 1, wherein ZT is at least the lowest number of impedance-transformer sections that provide impedance transformation between the first external-circuit impedance and each second external-circuit impedance over the operating bandwidth of the combiner/divider.

3. The combiner/divider of claim 2, wherein ZT is less than 1.2 times the lowest number of impedance-transformer sections that provide impedance transformation between the first external-circuit impedance and each second external-circuit impedance over the operating bandwidth of the combiner/divider.

4. The combiner/divider of claim 2, wherein ZT is equal to the lowest number of impedance-transformer sections that provide impedance transformation between the first external-circuit impedance and each second external-circuit impedance over the operating bandwidth of the combiner/divider.

5. The combiner/divider of claim 1, wherein the junction network includes at least a first junction, a first junction impedance at the first junction toward the sum port, a second junction impedance at the first junction toward the component ports, the first and second junction impedances are complex impedances, and the imaginary part of the first junction impedance is a conjugate of the imaginary part of the second junction impedance.

6. The combiner/divider of claim 5, wherein the imaginary part of the first junction impedance varies from a low end of the operating bandwidth to a high end of the operating bandwidth in a first direction and the imaginary part of the second junction impedance varies from the low end of the operating bandwidth to the high end of the operating bandwidth in a second direction that is opposite to the first direction.

7. The combiner/divider of claim 1, wherein the junction network includes a plurality of successive junction stages from the combiner/divider sum port to the combiner/divider component ports, wherein each junction stage includes a junction connecting a respective junction sum node to a plurality of respective junction component nodes and each junction sum node of a successive junction stage is connected to a junction component node of a preceding junction stage.

8. The combiner/divider of claim 7, wherein the junction network includes a first junction stage including a first junction having a first-stage sum node that is the junction-network sum node and a plurality of first-stage component nodes, and a second junction stage including a plurality of second junctions each having a second-stage sum node connected to a respective one of the plurality of first-stage component nodes and a plurality of second-stage component nodes that each is or is connected to a respective one of the plurality of junction-network component nodes.

9. The combiner/divider of claim 8, wherein there is at least a third impedance-transformer section between each first-stage component node and the respective second-stage sum node to which the first-stage component node is connected.

10. The combiner/divider of claim 1, wherein the at least a first impedance transforming section is a transmission line in the form of one of a waveguide, a coaxial transmission line, a slotline, a stripline, a microstrip, and a coplanar waveguide, and the at least a second impedance transforming section is a transmission line in the form of a different one of a waveguide, a coaxial transmission line, a slotline, a stripline, a microstrip, and a coplanar waveguide.

11. A method of designing an impedance transforming combiner/divider comprising:

determining a target operating bandwidth and insertion-loss variation of the combiner/divider;

determining a first external-circuit impedance of a first external circuit to which a sum port of the combiner/divider is to be connected;

determining a respective second external-circuit impedance of a respective second external circuit to which each of a plurality of component ports is to be connected;

determining a number ZT that is greater than one and less than two times the lowest number of quarter-wavelength impedance-transformer sections that provide impedance transformation between the first external-circuit impedance and each of the second external-circuit impedances over the operating bandwidth of the combiner/divider;

determining a configuration of a junction network electrically connecting a junction-network sum node to each of a plurality of junction-network component nodes;

determining a position of each of the impedance-transformer sections distributed in series between the sum port and each of the component ports by way of the junction network while constraining to ZT the number of impedance-transformer sections between the sum port and each of the component ports with the junction-network sum node connected to the sum port through at least a first impedance-transformer section of the ZT impedance-transformer sections and each junction-network component node connected to a respective one of the component ports through at least a respective second impedance-transformer section of the ZT impedance-transformer sections; and determining an impedance value of each of the impedance-transformer sections.

12. A combiner/divider produced in accordance with the method of claim 11.

13. The method of claim 11, wherein determining the configuration of the junction network includes determining a configuration of a first-stage junction having a first-stage sum node that is the junction-network sum node and a plurality of first-stage component nodes, and a plurality of second-stage junctions each having a second-stage sum node connected to a respective one of the plurality of first-stage component nodes and a plurality of second-stage component nodes that each is or is connected to a respective one of the plurality of junction-network component nodes.

14. A combiner/divider produced in accordance with the method of claim 13.

15. The method of claim 11, wherein determining a position of each of the impedance-transformer sections includes assigning at least a third impedance-transformer section between each first component node and the respective second sum node to which the first component node is connected.

16. A combiner/divider produced in accordance with the method of claim 15.

17. The method of claim 11, wherein determining the number ZT includes determining the number ZT that is at least the lowest number of impedance-transformer sections that provide impedance transformation between the first external-circuit impedance and each second external-circuit impedance over the operating bandwidth of the combiner/divider.

18. The method of claim 11, wherein determining the number ZT includes determining the number ZT that is less than 1.2 times the lowest number of impedance-transformer sections that provide impedance transformation between the first external-circuit impedance and each second external-circuit impedance over the operating bandwidth of the combiner/divider.

19. The method of claim 11, wherein determining the configuration of the junction network includes determining a configuration of at least a first junction; and the method further comprises determining a complex first junction impedance at the first junction toward the sum port and a complex second junction impedance at the first junction toward the component ports, wherein the imaginary part of the first junction impedance is a conjugate of the imaginary part of the second junction impedance.

20. The method of claim 19, wherein determining a complex first junction impedance and a complex second junction impedance includes determining an imaginary part of the first junction impedance that varies from a low end of the operating bandwidth to a high end of the operating bandwidth in a first direction and an imaginary part of the second junction impedance that varies from the low end of the operating bandwidth to the high end of the operating bandwidth in a second direction that is opposite to the first direction.

21. The method of claim 11, wherein determining the number ZT includes determining the number ZT that is equal to the lowest number of impedance-transformer sections that provide impedance transformation between the first external-circuit impedance and each second external-circuit impedance over the operating bandwidth of the combiner/divider.

\* \* \* \* \*